United States Patent [19]

van Dongen et al.

[11] 4,032,944

[45] June 28, 1977

[54] SEMICONDUCTOR DEVICE FOR GENERATING INCOHERENT RADIATION AND METHOD OF MANUFACTURING SAME

[75] Inventors: Teunis van Dongen; Rudolf Paulus Tijburg, both of Eindhoven, Netherlands

[73] Assignee: U.S. Philips Corporation, New York, N.Y.

[22] Filed: Jan. 15, 1976

[21] Appl. No.: 649,479

[30] Foreign Application Priority Data

Mar. 11, 1975 Netherlands ............... 7502844

[52] U.S. Cl. .................... 357/17; 357/49; 357/55; 357/56

[51] Int. Cl.² .................................... H01L 33/00

[58] Field of Search ............... 357/17, 18, 55, 56, 357/49

[56] References Cited

UNITED STATES PATENTS

| | | | |
|---|---|---|---|
| 3,479,614 | 11/1969 | Ashkin | 331/94.5 |
| 3,495,140 | 2/1970 | Cornely | 317/235 |
| 3,930,912 | 1/1976 | Wisbey | 156/3 |
| 3,932,927 | 1/1976 | Grenon | 29/577 |
| 3,974,514 | 8/1976 | Kressel | 357/17 |
| 3,978,428 | 8/1976 | Burnham | 331/94.5 H |

OTHER PUBLICATIONS

Shih & Blum, I.B.M. Tech. Discl. Bull., vol. 15, No. 7, Dec. 1972, p. 2345.
Shih & Blum, I.B.M. Tech. Discl. Bull., vol. 13, No. 9, Feb. 1971, p. 2494.

Primary Examiner—Martin H. Edlow
Attorney, Agent, or Firm—Frank R. Trifari

[57] ABSTRACT

A semiconductor device having a p-n junction for emitting incoherent radiation. According to the invention, one or several diodes are obtained in the same semiconductor body and starting from a substrate having a diffused or epitaxial layer of opposite conductivity types, by dividing the layer into one or more active regions by one or more grooves and bounding said islands by a cleavage plane at right angles to the p-n junction. Of the grooves, at least a part extends substantially parallel to the second surface. The body and preferably also the grooves are covered with an insulating layer in which a contact window is provided on the active regions and an electrode layer is provided over substantially the whole surface. As a result, small diodes having a large surface brightness are obtained on a body of handleable dimensions having a flat surface with a comparatively low current consumption.

18 Claims, 9 Drawing Figures

SEMICONDUCTOR DEVICE FOR GENERATING INCOHERENT RADIATION AND METHOD OF MANUFACTURING SAME

The invention relates to a semiconductor device for generating incoherent electromagnetic radiation and comprising a semiconductor body having at least one diode with a p-n junction which, when biased in the forward direction, can emit recombination radiation, the semiconductor body comprising a substrate region of a first conductivity type which forms the said p-n junction with a layer of the second conductivity type adjoining the said substrate region and adjoining a first substantially flat surface of the body, the recombination radiation being capable of emanating from the semiconductor body in a direction parallel to the p-n junction, the substrate region and the layer of the second conductivity type each having a connection conductor.

The invention relates in addition to a method of manufacturing such a semiconductor device.

Semiconductor devices in which recombination radiation can be generated by injection of charge carriers across a p-n junction biased in the forward direction are known and are utilized inter alia in the form of solidstate light sources which in general emit incoherent recombination radiation.

The light can emanate from the semiconductor body either in a direction at right angles to the p-n junction, or in a direction parallel to the p-n junction. When it is desired to obtain a surface brightness as large as possible, the last-mentioned method is to be preferred. A reason for this is inter alia that in this case the generation of radiation occurs in a zone which extends up to the surface where the p-n junction reaches said surface, while on the contrary in the case of radiation emanating at right angles to the p-n junction, a considerable part of said radiation is more or less strongly absorbed in the layer of the second conductivity type. Furthermore, with emanation of the radiation parallel to the p-n junction, an electrode may be provided on the semiconductor surface which is parallel to the p-n junction, and, if desired, a cooling member may be provided or the electrode, since it is not necessary for these to transmit radiation. As a result of this, the cooling may take place as closely as possible to the p-n junction, and so near the area where the largest heat dissipation occurs.

A semiconductor device as described above, in which the radiation emanates from the semiconductor body in a direction parallel to the p-n junction is known for example, from U.S. Pat. No. 3,290,539. In this device, however, the radiation, after emanation from a mesa-shaped diode in all directions parallel to the p-n junction, is reflected by a reflector in a direction at right angles to the p-n junction.

In some cases a very small light-emissive surface is desired from which radiation emanates substantially only in one direction, for example, for scanning an absorbing or reflecting pattern in which a high resolving power is essential. For that purpose, while maintaining a semiconductor body having readily handleable dimensions, a comparatively large p-n junction could be used and the radiation emitted thereby could be screened except for a small region. However, this is very uneconomical and requires much larger currents than are necessary for generating radiation via the desired very small surface. In particular when several adjacent diodes have to be operated, for example, for the simultaneous generation of radiation in places a small mutual distance apart, this easily leads to an inadmissibly high current consumption and to cooling problems.

It may also be decided to use very small mesa-diodes. However, due to their small surface area these are difficult to cool since special precautions have to be taken to assemble a cooling member having a flat surface in contact with the mesa in such manner that the cooling member does not contact other parts of the semiconductor surface or become tilted.

One of the objects of the invention is to avoid the said drawbacks occurring in the known devices or at least reduce them to a considerable extent.

The invention is based inter alia on the recognition of the fact that it is possible by the use of an efficaciously chosen structure, to manufacture a device of the kind described, the semiconductor body of which has readily handleable dimensions and has a substantially flat surface present near the p-n junction, in which an electrode layer can extend throughout said surface and can hence be cooled in a simple manner throughout its surface, while nevertheless the active part of the p-n junction, where the recombination radiation is genrated is considerably smaller than the said flat surface.

A semiconductor device of the kind mentioned in the preamble is therefore characterized according to the invention in that the first surface has a groove which extends from said surface over at least the greater part of the thickness of the layer of the second conductivity type, at least an active part of said layer being at least partially bounded at least for a part by said groove and by a substantially flat second surface of the body, said second surface intersecting the first surface and the p-n junction substantially at right angles. The generated radiation being capable of emanating via said second surface and at least a part of the groove extends substantially parallel to the said second surface, with at least a greater part of the first surface being covered with an electrically insulating layer in which a contact window is provided on the active part of the layer of the second conductivity type. An electrically conductive electrode layer is present on substantially the whole first surface and on the insulating layer and adjoins the layer of the second conductivity type within the contact window.

The structure according to the invention has the important advantage that radiation can emanate via a very small surface of large surface brightness with a minimum current consumption, while the semi-conductor body can have handleable dimensions which are much larger than the surface of the radiation-emitting p-n junction. In addition the semiconductor body has a substantially flat surface which is interrupted only by the groove and which can easily be cooled by contacting it with a single flat cooling plate.

A good boundary of the active part is otherwise when the active part of the layer of the second conductivity type is bounded for a part by the groove and for the remaining part by the second surface.

The electrically insulating layer preferably also covers the groove entirely, so that the electrode layer can extend also within the groove on the insulating layer and need not be interrupted.

The groove ensures that the current flows only through the radiation-emitting island-shaped part of the p-n junction extending below the whole surface and can hence be maintained small. Although it may be sufficient therefor under certain circumstances that the groove extends at least over half of the thickness of the layer of the second conductivity type but not entirely down to the p-n junction, the groove will preferably extend at least down to the p-n junction. As a result of this the p-n junction is intersected by the groove and the radiation-emitting part of the junction will be insulated electrically entirely from the remaining part of the junction so that the current can flow only through the radiating island-shaped pat of the p-n junction.

The second surface of the body, that is the surface through which the radiation emanates, can be obtained by sawing and etching and as such it may have any orientation. Preferably, however, the second surface is a cleavage plane of the crystal since by cleaning a substantially perfectly flat surface can be obtained in a simple manner and without loss of material.

In many cases in which two or more radiation beams are necessary, the semiconductor body may comprise at least two of the said active regions which both adjoin the same first and second surface.

Although any device with a radiation-emissive p-n junction may have the structure according to the invention, a particularly efficient preferred embodiment according to the invention is characterized in that the substrate region consists of a plate of n-type GaAs on which is grown an epitaxial layer of n-type $Ga_{1-x}Al_xAs$ ($0.1 \leq x \leq 0.7$) and that the layer of the second conductivity type is composed of a layer of p-type $Ga_{1-y}Al_yAs$ ($0 \leq y \leq 0.5$; $y \leq x$) grown epitaxially on the said epitaxial layer, a layer of p-type $Ga_{1-m}Al_mAs$ ($0.1 \leq m \leq 0.7$; $y \leq m$) grown thereon epitaxially and a layer of p-type GaAs grown thereon epitaxially.

The invention furthermore relates to a method of manufacturing the described device, which method is characterized in that starting material is a semiconductor plate having a substrate region of a first conductivity type and a layer of the second conductivity type which adjoins a substantially flat first surface of the plate and which forms a p-n junction with the substrate region of the first conductivity type, which junction can emit radiation. At least two mutually parallel grooves and at least one groove extending substantially at right angles thereto are provided in the first surface, which grooves extend at least substantially down to the p-n junction, and at least a cleavage plane is provided at right angles to the p-n junction and to the said parallel grooves. The first surface including the grooves is covered with an electrically insulating layer and a contact window is provided in the insulating layer on at least an active part of the layer of the second conductivity type bounded by two parallel grooves, by a groove extending at right angles thereto, and by the cleavage plane, and an electrode layer is provided on the insulating layer and in the contact window.

The sequence in which said process steps are carried out may be varied. According to a preferred embodiment which is particularly suitable for the simultaneous manufacture of several of the described devices, first the grooves, the insulating layer, the contact window or the contact windows, and the electrode layer are provided, after which the cleavage plane is provided.

The invention will now be described in greater detail with reference to a few embodiments and the drawings in which.

The Figures are diagrammatic and not drawn to scale. Corresponding parts in the two embodiments are as a rule referred to the same reference numerals. In the cross-sectional views semiconductor regions of the same conductivity type are shaded in the same direction.

Figure 1:
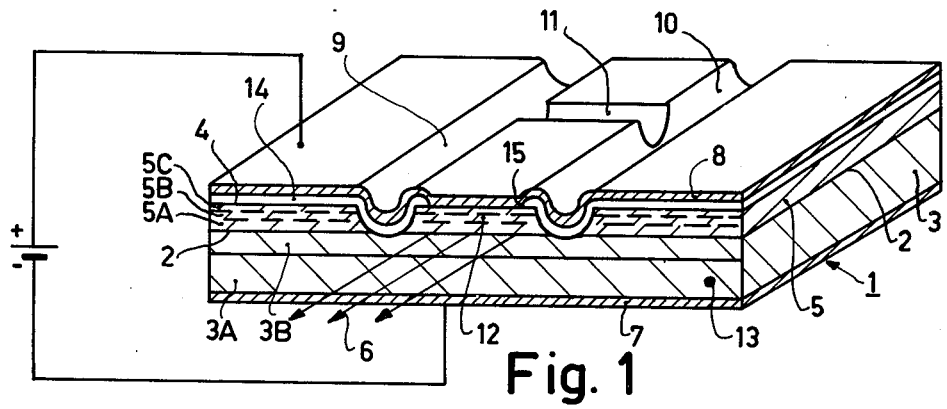
FIG. 1 is a partial sectional perspective view of a device according to the invention.

FIG. 1 is a partial sectioned perspective view of a semiconductor device according to the invention for generating incoherent electromagnetic radiation. The device comprises a monocrystalline semi-conductor body 1 having a diode with a p-n junction 2 which, when biased in the forward direction can emit recombination radiation. The semi-conductor body comprises a substrate region 3 of a first conductivity type (in this example of the n-conductivity type) which forms the said p-n junction 2 with a layer 5 of the second conductivity type (in this example of the p-conductivity type) adjoining the said substrate region 3 and a first substantially flat surface 4 of the body. The recombination radiation denoted by the arrows 6 can emanate in a direction parallel to the p-n junction 2. The substrate region 3 has a connection conductor in the form of a metal layer 7 and the layer 5 also has a connection conductor in the form of an electrode layer 8. According to the invention the said first surface 4 has a groove (9, 10, 11) which extends from said surface 4 over at least the greater part of the thickness, in this example throughout the thickness, of the layer 5, the groove (9, 10, 11) in this example extending down to a greater depth than the p-n junction 2. An active part 12 of the layer 5 is formed which is bounded for a part by the groove (9, 10, 11) and for the remaining part by a substantially flat second surface 13 of the body, surface 13 intersecting both the first surface 4 and the p-n junction 2 substantially at right angles. The second surface 13 in this case is a (110) cleavage plane of the crystal from which the radiation can emanate in the direction of the arows 6. According to the invention, furthermore the groove (9, 10, 11) and at least the greater part of the surface 4 are covered with an electrically insulating layer 14, in this example of silicon oxide, in which a contact window 15 is provided on the island-shaped region 12, and the insulating layer 14 is also covered with an electrically conductive electrode layer 8 which adjoins the layer 5 within the contact window 15.

In this manner a semiconductor device for generating incoherent radiation is obtained whose semiconductor body has handleable dimensions (in this example 300 × 300 micron), while the surface of the island-shaped part 12 is much smaller and in this example is only 10 × 50 microns. Since as a result of the presence of the insulating layer 14 the current can flow only through the island-shaped part 12 of the layer 5, a large surface brightness can be obtained with a low current consumption. In addition, the upper surface of the plate is substantially flat, so that this can be readily cooled by a cooling member 16 having a substantially flat surface 17 which is connected to the electrode layer 8, for example, by means of a layer of solder 18. The solder 18 may fill possible small intermediate spaces, as is shown in the diagrammatic cross-sectional view of FIG. 2.

In this example the groove (9, 10, 11) is composed of two mutually substantially parallel parts 9 and 10 extending substantially at right angles to the second surface 13, and a third part 11 which extends substantially parallel to the second surface 13 and connects the mutually parallel grooves 9 and 10. Such a groove can easily be manufactured. In principle, however, a U-shaped groove which is closed at its open end by the surface 13 might also be useful.

The active part 12 of the layer 5 of the second conductivity type in this example has a dimension parallel to the second surface of less than 20 microns.

A particularly efficient embodiment of a radiation-emissive diode is obtained in this example in that the substrate region 3 consists of a plate 3A of n-type GaAs having a thickness of approximately 100 microns and a doping of approximately $10^{18}$ atoms per $cm^3$, on which is grown an epitaxial layer 3B of n-type $Ga_{1-x}Al_xAs$ ($0.1 \leq X \leq 0.7$) having a doping of approximately $2 \times 10^{17}$ atoms per $cm^3$ and a thickness of approximately 7 microns, while the p-type layer 5 is composed of a layer 5A of p-type $Ga_{1-y}Al_yAs$ ($0 \leq y \leq 0.5; y \leq x$) grown epitaxially on the epitaxial layer 3B and having a doping of approximately $2 \times 10^{17}$ atoms per $cm^3$, and a layer 5B of p-type $Ga_{1-m}Al_mAs$ ($0.1 \leq m \leq 0.7; y \leq m$) grown thereon and having a doping of approximately $2.5 \cdot 10^{17}$ atoms per $cm^3$ and a thickness of approximately 1.5 microns, and a layer 5C of p-type GaAs grown thereon and having a doping of approximately $10^{18}$ atoms per $cm^3$ and a thickness of approximately 1.5 microns.

Although other orientations may also be used, there has been closed in this example a (100) face for the first surface 4 and a (110) face for the second surface. The (110) face can easily be obtained as a cleavage plane.

Figure 2:
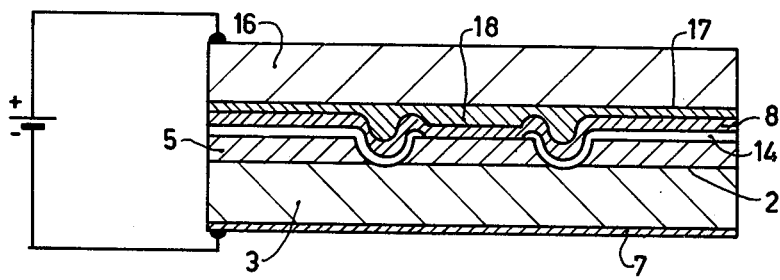
FIG. 2 is a diagrammatic cross-sectional view of the device shown in FIG. 1 having a cooling plate.
Figure 4:
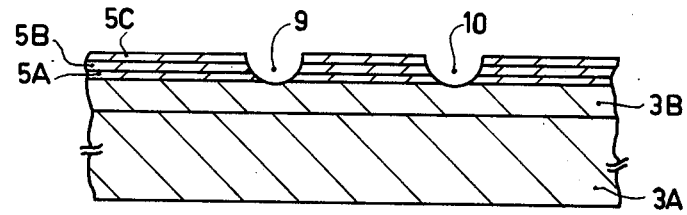
Figure 5:
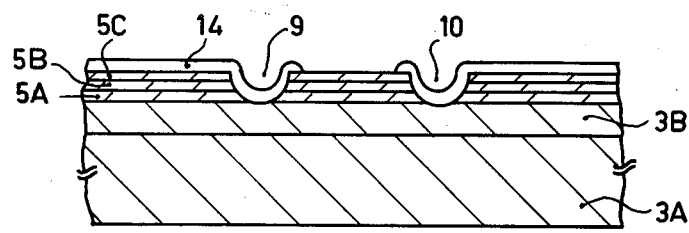

According to the invention, the device shown in FIG. 1 and 2 can advantageously be manufactured as follows. Starting material (see FIG. 39 is a semiconductor plate 3A of n-type GaAs having a thickness of approximately 400 microns and a doping of approximately $10^{18}$ atoms per $cm^3$ on which in known manner, for example, by using the liquid epitaxy method described inter alia in "Journal of the Electrochemical Society" volume 118, January 1971, No. 1, pp. 150 to 152 there are grown successively a 7 microns thick layer 3B of n-type $Ga_{1-x}Al_xAs$, a 1 micron thick layer 5A of p-type $Ga_{1-y}Al_yAs$, a 1.5 micron thick layer 5B of p-type $Ga_{1-m}Al_mAs$ and a 1.5 micron thick layer 5C of p-type GaAs with the dopings and the values for $x$, $y$ and $m$ as described above. Then by, for example, etching with an etchant solution containing $H_2SO_4$, $H_2O_2$ and $H_2O$ and while using an etching mask of photoresist (not shown), the grooves 9, 10 and 11 are provided (see FIG. 4) which extend to beyond the p-n junction 2 (the groove 11 is not visible in the cross-sectional view shown in FIG. 4). A 0.25 micron thick layer 14 of silicon oxide is then provided throughout the surface including the grooves, for example, by pyrolytic deposition of $SiO_2$, after which in said layer 14 a contact window 15 is provided by a photolithographic etching process on the region present within the grooves 9, 10 and 11.

Figure 6:
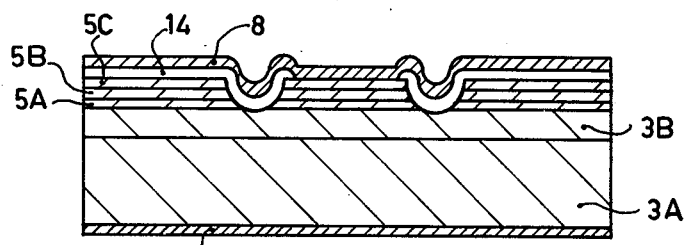

The whole upper surface is then covered (see FIG. 6) with an electrode layer 8, in this example a vapour-deposited or differently-provided metal layer, although in certain circumstances a layer of readily-conductive polycrystalline silicon may, for example, also be used. The layer 8 makes a contact, preferably an ohmic contact, with the p-type layer 5C only in the contact window. By grinding and/or etching, the overall thickness of the plate 3A is also reduced to approximately 100 microns and an electrode layer 7, for example a metal layer which preferably makes an ohmic contact with the plate 3A, is provided on the lower surface. These latter process steps may be carried out at any suitably chosen instant in the process. In this manner the structure shown in FIG. 6 is obtained. The plate is finally cleft at right angles to the groove 9 and 10 according to a (110) face. The device shown in FIG. 1 is then obtained which is then provided with a cooling plate 16, for example, in the manner as shown in FIG. 2.

Figure 7:
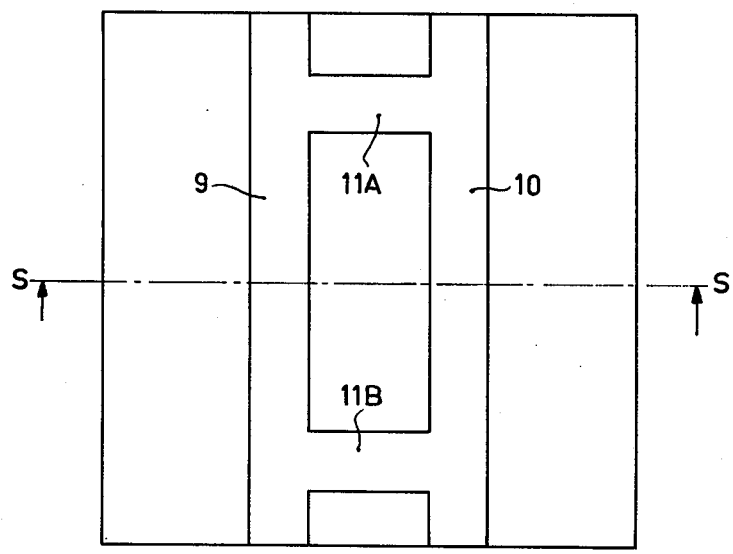
FIG. 7 is a plan view of the device shown in FIG. 1 in the manufacturing stage shown in FIG. 6.

It is possible in this manner to manufacture simultaneously two or more devices of the kind described, for example, as is shown in FIG. 7. This Figure is a plan view of the structure in the stage shown in FIG. 6, in which two grooves 11A and 11B are provided at right angles to the grooves 9 and 10. After cleaving according to the plane S-S, two similar devices are obtained on either side of the cleavage plane.

Figure 8:
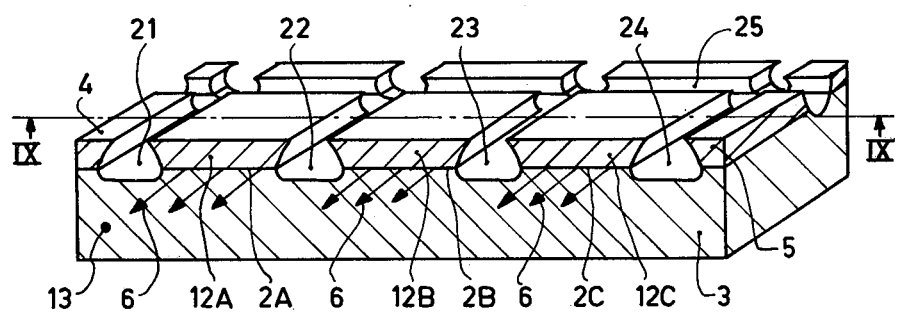
FIG. 8 is a partial cross-sectional perspective view of a part of another device according to the invention.
Figure 9:
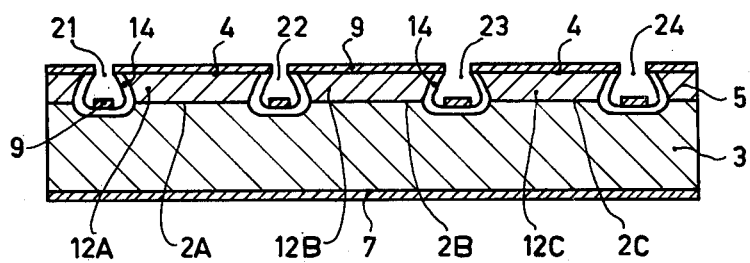
FIG. 9 is a diagrammatic cross-sectional view taken on the line IX—IX of FIG. 8.

It is also possible to provide several diodes in one semiconductor body, as is shown in FIG. 8 and FIG. 9. FIG. 8 is a partial cross-sectional perspective view of a device in which the semiconductor body consisting of the substrate region 3 of the first conductivity type and the layer 5 of the second conductivity type comprises at least two, in this example three, active regions 12A, B and C all adjoining the same first (100) surface 4 and the same second surface 13 which in this case also is a (110) cleavage plane. The insulating layer 14 and the electrodes 7 and 9 (which are shown in the cross-sectional view of FIG. 9) are omitted in FIG. 8 for reasons of clarity.

In the device shown in FIGS. 8 and 9, the grooves 21 to 24 which are mutually parallel and extend substantially at right angles to the cleavage plane 13, and if desired also the groove 25 which extends substantially parallel to the cleavage plane 13, have such a shape that the groove as it extends from the first surface 4 into the body first widens and then narrows as is clearly visible in the Figure. One of the advantages of this is that the p-n junctions 2A, B and C present in the island-shaped parts 12A, B and C are of smaller area than the contact are between the electrode layer 9 and the layer 5 of the second conductivity type, as a result of which the surface brightness can even be larger with the same current.

A further advantage of the use of grooves having this profile is that in this manner the electrode layer 9 can easily be interrupted at the area of the groove, as is shown in FIG. 9. Thus, when the electrode layer 9 is provided by vapour-deposition in a direction substantially at right angles to the surface 4, the overchanging edges of the grooves 21 to 24 ensure that the parts of the electrode layer present on the island-shaped parts 12A, 12B and 12C are separated from each other so that different voltages can be applied to the individual diodes. When this is not necessary or desired, grooves of the type shown in FIGS. 1 and 2 may be used with a coherent electrode layer so that the island-shaped regions 12A, B and C are all contacted by the same coherent electrode layer and in the operating condition the same voltage is set up across the diodes.

The grooves 21 to 24 shown in FIGS. 8 and 9 can be obtained by etching, for example, as described in IBM Technical Disclosure Bulletin, Volume 12, No. 3, August 1969, p. 427, by means of a preferential etchant containing $NH_4OH$, $H_2O_2$ and $H_2O$. In a composite layer 5 as described in the preceding Example, such grooves can also be obtained by using an etching method in which the upper layer 5C is attacked less rapidly than the underlying layer 5B, as described in Japanese Journal of Applied Physics, Volume 12, 1973, no. 4, pp. 619–620.

The insulating layer 14 can be obtained in the manner shown in FIG. 9, for example, by maintaining the masking layer necessary for etching the grooves after said etching, and then oxidizing the exposed wall of the grooves anodically before removing the masking layer.

The devices described can emit recombination radiation when the p-n junction 2 is biased in the forward direction, which radiation, however, is incoherent. Coherent radiation (laser radiation) cannot be emitted by said devices since the resonant cavity required for that purpose is absent (there is only one cleavage plane at right angles to the p-n junction; on the oppositely located side the island-shaped region is bounded by the groove 11 the wall of which in general is not at right angles to the p-n junction).

Although in these examples the layer 5 is an epitaxial layer, a diffused layer 5 obtained, for example, by diffusing zinc in an n-type GaAs substrate, may also be used.

It will be obvious that the invention is not restricted to the embodiments described but that many variations are possible to those skilled in the art without departing from the scope of this invention. For example, semiconductor materials other than those mentioned in the examples may be used, for example, Si, Ge, GaP. The said conductivity types may also be replaced by the opposite conductivity types, while in addition the profile, the shape and the depth of the grooves may be varied. The device shown in FIGS. 8 and 9 may be provided with a cooling plate in the same manner as that shown in FIGS. 1 and 2. At the surface where the radiation emanates the devices may be provided with an anti-reflection layer.

What is claimed is:
1. A semiconductor device for generating incoherent electromagnetic radiation and comprising:
   a. a semiconductor body having at least one diode with a p,n junction, said semiconductor body comprising:
      i. a substrate region of first conductivity type,
      ii. a first layer of secondconductivity type that comprises an active part and adjoins both said substrate region and a substantially flat first surface of siad body, and
      iii. a substantially flat second surface that intersects said first surface and said p,n junction substantially at right angles, said substrate region and said first layer forming said p,n junction, said junction being capable when biased in the forward direction, of emitting recombination radiation from said second surface in a direction parallel to said p,n junction, said first surface having a groove which extends from said surface through at least the greater part of thickness of said first layer, at least said active part of said first layer being at least partially bounded by said groove and by said second surface, at least a part of said groove extending substantially parallel to said second surface,
   b. connection conductor means associated respectively with said substrate region and said first layer,
   c. an electrically insulating disposed over at least a major part of said first surface and comprising a contact window at said active part of said first layer, and
   d. an electrically conductive electrode layer present on substantially the whole said first surface and on said insulating layer, said electrode layer adjoining said first layer within said contact window.

2. A semiconductor device as in claim 1, wherein said active part of said first layer is bounded along a part thereof by said groove and for the remaining part by the second surface.

3. A semiconductor device as in claim 1, wherein said electrically insulating layer entirely covers said groove.

4. A semiconductor device as in claim 1, wherein said groove extends down to at least said p,n juction.

5. A semiconductor device as in claim 1, wherein said groove is composed of two mutually substantially parallel parts extending substantially at right angles to said second surface and a third part which extends substantially parallel to said second surface and connects said mutually parallel parts.

6. A semiconductor device as in claim 1, wherein said second surface is a cleavage plane of said semiconductor crystal.

7. A semiconductor device as in claim 1, wherein said active part of said first layer has a dimension, in the direction parallel to said second surface, of at most 100 microns.

8. A semiconductor device as in claim 1, wherein said active part of said first layer has a dimension, in the direction parallel to said second surface, of at most 20 microns.

9. A semiconductor device as in claim 1, comprising a cooling member having a substantially flat surface and connected thereat to said electrode layer.

10. A semiconductor device as in claim 1, wherein said substrate region consists of a plate of n-type GaAs and a grown first epitaxial layer of n-type $Ga_{1-x}Al_xAs$ ($0.1 \leq x \leq 0.7$), located thereon and said first layer being composed of a grown second epitaxial layer of p-type $Ga_{1-y}Al_yAs$ ($0 \leq y \leq 0.5$; $y \leq x$) disposed on the said first epitaxial layer, a third grown epitaxial layer of p-type $Ga_{1-m}Al_mAs$ ($0.1 \leq m \leq 0.7$; $y \leq m$) disposed on said second epitaxial layer and a grown fourth epitaxial layer of p-type GaAs disposed on said third epitaxial layer.

11. A semiconductor device as in claim 1, wherein said first surface is a (100) face and said second surface is a (110) face.

12. A semiconductor device as in claim 1, wherein at least a part of said groove has a profile which, in the direction from said firsrt surface inward, first widens and then narrows.

13. A semiconductor device as in claim 12, wherein said p,n junction present in said active part has a smaller area than said contact area between said electrode layer and the said second conductivity type first layer.

14. A semiconductor device as in claim 1, wherein said semiconductor body comprises at least two of said active regions, both of which adjoins the same first and second surfaces.

15. A semiconductor device as in claim 14, wherein said electrode layer is interrupted at the area of the groove between said two active regions.

16. A semiconductor device as in claim 14, wherein active regions are both contacted by the same coherent electrode layer.

17. A method of manufacturing a semiconductor device as in claim 19, comprising the steps of:
 a. providing a semiconductor plate having a substrate region of a first conductivity type and a first layer of second conductivity type, said first layer adjoining a substantially flat first surface at said plate and forming with said substrate region a p,n junction that can emit radiation,
 b. providing at said first surface at least two mutually parallel grooves and at least one groove extending substantially at right angles thereto, said grooves extending at least substantially down to said p,n junction,
 c. providing at least a cleavage plane disposed at right angles to said p,n junction and to said parallel grooves,
 d. covering said first surface including said grooves with an electrically insulating layer that comprises a contact window located at at least one active part of said second conductivity type first layer, said at least one active part being bounded by said grooves and by said cleavage plane, and
 e. providing an electrode layer on said insulating layer and in said contact window.

18. A method as in claim 17, wherein said grooves, said insulating layer, said contact window or contact windows, and said electrode layer are provided before said cleavage plane is provided.

* * * * *

UNITED STATES PATENT AND TRADEMARK OFFICE
CERTIFICATE OF CORRECTION

PATENT NO. : 4,032,944
DATED : June 28, 1977
INVENTOR(S) : TEUNIS VAN DONGEN ET AL It is certified that error appears in the above-identified patent and that said Letters Patent are hereby corrected as shown below:

Column 1, line 45, change "or" to --on--

Column 2, line 34, delete "at least for a part"

line 38, delete "being" and insert --is--

Figure 3:
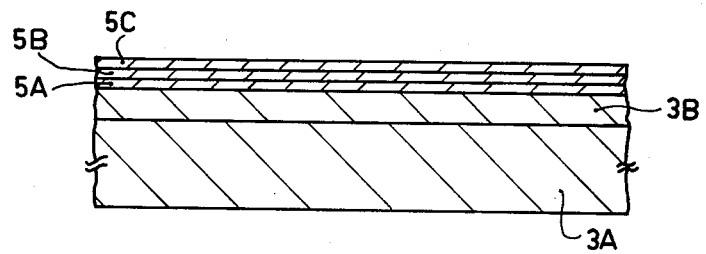
FIGS. 3 through 6 are diagrammatic cross-sectional views of the device shown in FIG. 1 in successive stages of manufacture.

Column 5, line 35, "$2.5.10^{17}$" should be --$2.5 \times 10^{17}$-- line 41, "closed" should be --chosen-- line 47, "(see Fig. 39" should be --(see Fig. 3)--

Claim 4, line 2, "juction" should be --junction--

Claim 17, line 2, "19" should be --1--

Signed and Sealed this

Twenty-fifth Day of October 1977

[SEAL]

Attest:

RUTH C. MASON
Attesting Officer

LUTRELLE F. PARKER
Acting Commissioner of Patents and Trademarks

United States Patent and Trademark Office

CERTIFICATE OF CORRECTION

PATENT NO. : 4,032,944
DATED : June 28, 1977
INVENTOR(S) : TEUNIS VAN DONGEN ET AL It is certified that error appears in the above-identified patent and that said Letters Patent are hereby corrected as shown below:

Claim 1, Column 7, line 61, "siad" should be --said--

Claim 1, Column 8, line 11, "insulating disposed" should be --insulating layer disposed--

Signed and Sealed this

Twenty-eighth Day of March 1978

[SEAL]

Attest:

RUTH C. MASON
Attesting Officer

LUTRELLE F. PARKER
Acting Commissioner of Patents and Trademarks